(12) United States Patent
Li et al.

(10) Patent No.: US 12,376,262 B2
(45) Date of Patent: Jul. 29, 2025

(54) SERVER APPARATUS AND SOLID-STATE STORAGE DEVICE THEREOF

(71) Applicant: Shannon Systems Ltd., Shanghai (CN)

(72) Inventors: Jiangshan Li, Shanghai (CN); Jia He, Shanghai (CN)

(73) Assignee: SHANNON SYSTEMS LTD., Shanghai (CN)

( * ) Notice: Subject to any disclaimer, the term of this patent is extended or adjusted under 35 U.S.C. 154(b) by 253 days.

(21) Appl. No.: 18/330,586

(22) Filed: Jun. 7, 2023

(65) Prior Publication Data

US 2024/0121911 A1    Apr. 11, 2024

(30) Foreign Application Priority Data

Oct. 9, 2022 (CN) .......................... 202211226062.5

(51) Int. Cl.
*H05K 7/20* (2006.01)

(52) U.S. Cl.
CPC ..... *H05K 7/20254* (2013.01); *H05K 7/20772* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,019,974 B2* | 3/2006 | Lee | ........................... | G06F 1/20 174/15.2 |
| 7,852,632 B2* | 12/2010 | Chu | ...................... | H01L 23/427 257/E23.099 |
| 9,720,461 B2* | 8/2017 | Czamara | ................... | G06F 1/20 |
| 10,123,441 B2* | 11/2018 | Wang | ...................... | H05K 7/026 |
| 10,186,471 B2* | 1/2019 | Chen | ......................... | G06F 1/20 |
| 10,477,706 B1* | 11/2019 | Wang | ...................... | H05K 5/026 |
| 10,582,640 B2* | 3/2020 | Cader | ................ | H05K 7/20509 |
| 11,606,866 B2* | 3/2023 | Li | ......................... | G11B 33/022 |
| 11,700,707 B2* | 7/2023 | Li | ............................. | G06F 1/20 361/694 |
| 11,723,158 B2* | 8/2023 | Li | ........................ | G11B 33/025 361/752 |
| 2007/0171616 A1* | 7/2007 | Peng | ..................... | H01L 23/467 361/700 |
| 2018/0151469 A1* | 5/2018 | Chen | ........................ | H01L 23/42 |
| 2018/0184537 A1* | 6/2018 | Wang | ..................... | H05K 1/189 |
| 2022/0369502 A1* | 11/2022 | Li | ..................... | H05K 7/20154 |
| 2022/0369515 A1* | 11/2022 | Li | ............................ | G06F 1/20 |
| 2022/0377914 A1* | 11/2022 | Li | ........................ | G11B 33/025 |

(Continued)

*Primary Examiner* — Lisa Lea-Edmonds
(74) *Attorney, Agent, or Firm* — McClure, Qualey & Rodack, LLP

(57) ABSTRACT

A solid-state storage device is provided. The solid-state storage device includes a case, a solid-state storage module, and a heat dissipation unit. The case includes a receiving space. The solid-state storage module is disposed in the receiving space of the case. The heat dissipation unit is connected to the case. The heat dissipation unit covers the receiving space and is thermally connected to the solid-state storage module. The heat dissipation unit includes a working fluid, a cooling channel, and at least one heat conductive rib. The cooling channel extends into the heat dissipation unit. The working fluid travels in the cooling channel. The heat conductive rib extends into the cooling channel. The solid-state storage device satisfies the specification of SNIA SFF-TA-1008.

15 Claims, 11 Drawing Sheets

(56) References Cited

U.S. PATENT DOCUMENTS

2022/0377915 A1\* 11/2022 Li .................. H05K 5/0052
2024/0121911 A1\* 4/2024 Li .................. H05K 7/20772
2024/0121921 A1\* 4/2024 Li .................. H05K 7/20772

\* cited by examiner

SERVER APPARATUS AND SOLID-STATE STORAGE DEVICE THEREOF

CROSS REFERENCE TO RELATED APPLICATIONS

This application claims priority of China Patent Application No. 202211226062.5, filed on Oct. 9, 2022, the entirety of which is incorporated by reference herein.

BACKGROUND OF THE INVENTION

Field of the Invention

The present invention relates to a solid-state storage device, and in particular to a solid-state storage device with a cooling channel.

Description of the Related Art

Conventional solid-state storage devices, such as M2-sized solid-state storage devices, consume relatively little power. However, with the increased storage requirements of today's electronic devices, the power consumption of solid-state storage devices has been gradually increasing, and a new heat dissipation design for solid-state storage devices is thus required. The product width of conventional M2-sized solid-state storage devices is only 22.5 mm, which makes it difficult to employ water-cooled heat dissipation. There is no water-cooled heat dissipation design on the market that can be used in large solid-state storage devices that use the E3S/ESL specification.

BRIEF SUMMARY OF THE INVENTION

Embodiments of the invention are provided to address the aforementioned difficulty.

In one embodiment, a solid-state storage device is provided. The solid-state storage device includes a case, a solid-state storage module, and a heat dissipation unit. The case includes a receiving space. The solid-state storage module is disposed in the receiving space of the case. The heat dissipation unit is connected to the case. The heat dissipation unit covers the receiving space and is thermally connected to the solid-state storage module. The heat dissipation unit includes a working fluid, a cooling channel, and at least one heat conductive rib. The cooling channel extends into the heat dissipation unit. The working fluid travels in the cooling channel. The heat conductive rib extends into the cooling channel. The solid-state storage device satisfies the specification of SNIA SFF-TA-1008.

In one embodiment, the solid-state storage device satisfies the specification of E3S-2T.

In one embodiment, the heat dissipation unit comprises a first unit housing and a second unit housing, the second unit housing is located between the first unit housing and the solid-state storage module, the first unit housing comprises a first groove, the second unit housing comprises a second groove, and the first groove is combined with the second groove to form the cooling channel.

In one embodiment, the first unit housing comprises a plurality of first heat conductive ribs, the first heat conductive ribs are formed in the first groove and extend along the first groove, the second unit housing comprises a plurality of second heat conductive ribs, the second heat conductive ribs are formed in the second groove and extend along the second groove, and the first heat conductive ribs correspond to the second heat conductive ribs.

In one embodiment, the heat dissipation unit further comprises two elastic waterproof strips, the first unit housing comprises two waterproof slots, the waterproof slots are formed on both sides of the first groove and extend along the first groove, and the elastic waterproof strips are embedded in the waterproof slots.

In one embodiment, the second unit housing comprises two waterproof ribs, the waterproof ribs are formed on both sides of the second groove and extend along the second groove, the waterproof ribs press the elastic waterproof strips, and the waterproof ribs are inserted into the waterproof slots.

In one embodiment, the heat dissipation unit further comprises a first joint and a second joint, the first joint is connected to the first unit housing and the second unit housing and communicates with one end of the cooling channel, and the second joint is connected to the first unit housing and the second unit housing and communicates with the other end of the cooling channel.

In one embodiment, the first unit housing comprises a plurality of heat dissipation protrusions and a first surface, and the heat dissipation protrusions are formed on the first surface.

In one embodiment, the heat dissipation protrusions comprise a plurality of first heat dissipation protrusions and a plurality of second heat dissipation protrusions. The first heat dissipation protrusions are arranged in a matrix. Each second heat dissipation protrusion is longer than each first heat dissipation protrusion. The second heat dissipation protrusions are parallel to each other.

In one embodiment, the second unit housing comprises a second surface, the second surface is opposite to the first surface, the second surface faces the solid-state storage module, and the second surface is connected to the solid-state storage module.

In one embodiment, the heat dissipation unit comprises a plurality of unit bolts, the second unit housing comprises a plurality of housing through holes, the unit bolts pass through the housing through holes from the second surface to affix the second unit housing to the first unit housing.

In one embodiment, the solid-state storage device further comprises a plurality of thermal pads, wherein the thermal pads are sandwiched between the solid-state storage module and the second surface of the second unit housing.

In one embodiment, the solid-state storage module comprises a substrate, a controller chip, a plurality of DRAM chips and a plurality of flash memory chips, the controller chip, the DRAM chips and the flash memory chips are disposed on the substrate, the controller chip, at least a portion of the DRAM chips and at least a portion of the flash memory chips are thermally connected to the second surface of the second unit housing via the thermal pads.

In one embodiment, the solid-state storage module further comprises a plurality of power supplies and a capacitor, and the power supplies and the capacitor are disposed on the substrate.

In one embodiment, a server apparatus is provided. The server apparatus includes a mainboard, a cooling circulation pipeline and a plurality of solid-state storage devices. The solid-state storage devices are coupled to the circuit board. At least one of the solid-state storage devices comprises a case, a solid-state storage module, and a heat dissipation unit. The case comprises a receiving space. The solid-state storage module is disposed in the receiving space of the case. The heat dissipation unit is connected to the case, wherein the heat dissipation unit covers the receiving space and is thermally connected to the solid-state storage module, the heat dissipation unit comprises a cooling channel and at least one heat conductive rib, the cooling channel extends into the heat dissipation unit, the cooling channel communicates with the cooling circulation pipeline, a working fluid travels in the cooling channel and the cooling circulation pipeline, and the heat conductive rib extends into the cooling channel. The solid-state storage device satisfies the specification of SNIA SFF-TA-1008.

In the solid-state storage device of the embodiment of the invention, the heat dissipation unit is thermally connected to the solid-state storage module to remove heat. The receiving space is formed by the heat dissipation unit and the case, and the thickness of the solid-state storage device can be reduced to satisfy the specification of SNIA SFF-TA-1008. The heat conductive rib is disposed in the cooling channel to improve heat conduction effect. The restriction stages abut the solid-state storage module and restrict the solid-state storage module, and the number of the bolts for assembly is reduced.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
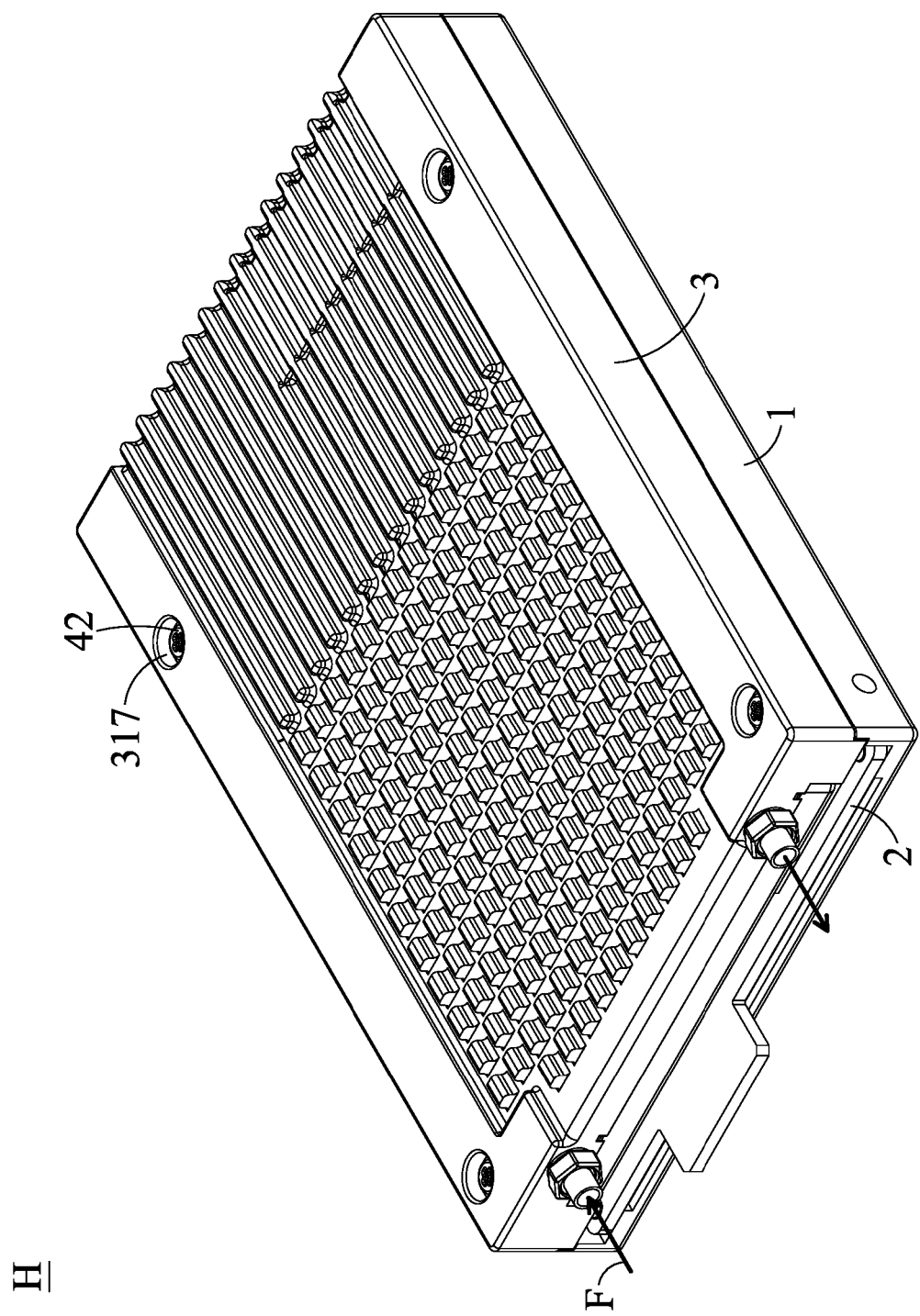
FIG. 1 is a perspective view of a solid-state storage device of the embodiment of the invention.
Figure 2:
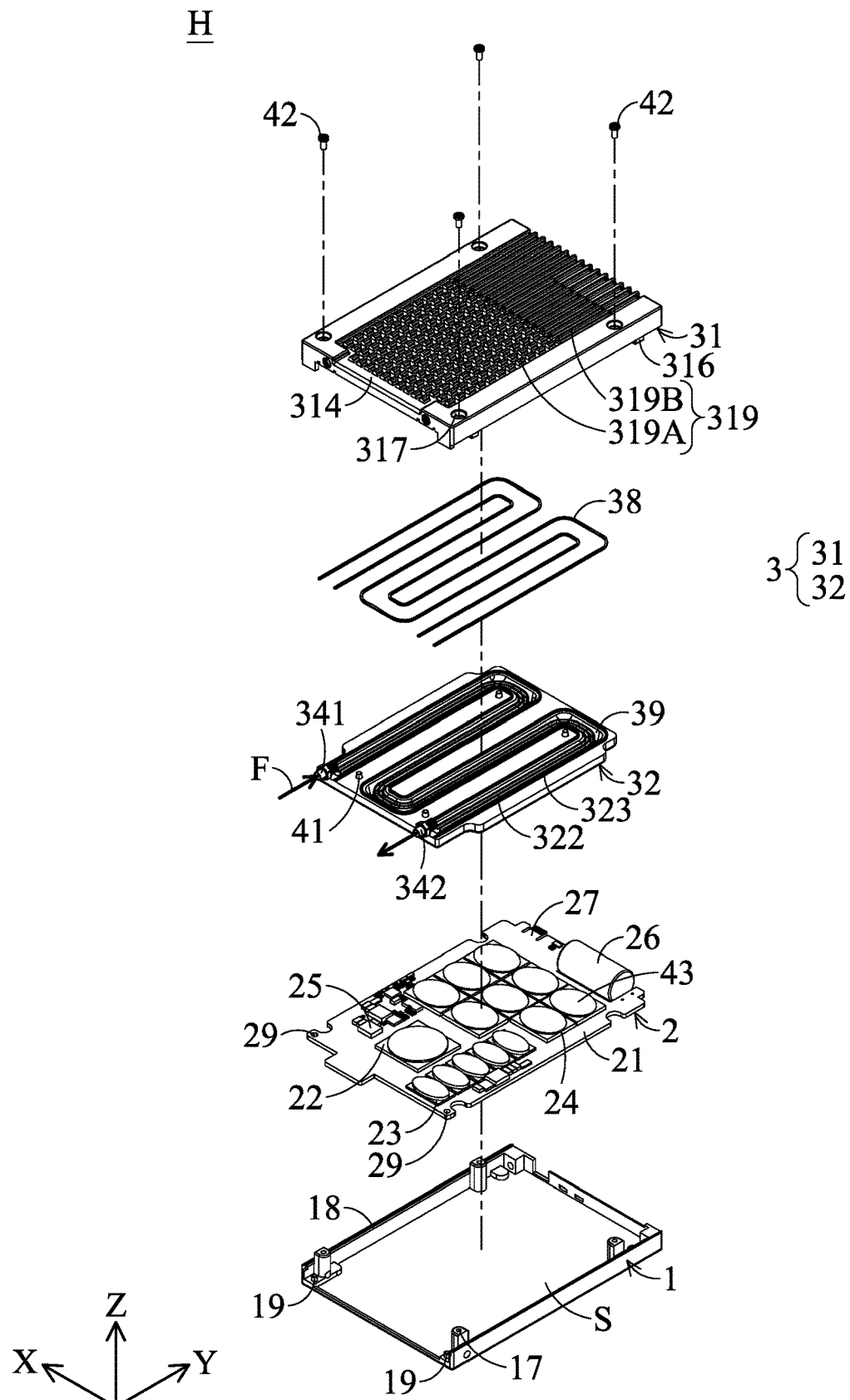
FIG. 2 is an exploded view of the solid-state storage device of the embodiment of the invention.

FIG. 1 is a perspective view of a solid-state storage device of the embodiment of the invention. FIG. 2 is an exploded view of the solid-state storage device of the embodiment of the invention. With reference to FIGS. 1 and 2, the solid-state storage device H of the embodiment of the invention includes a case 1, a solid-state storage module 2 and a heat dissipation unit 3. The case 1 includes a receiving space S. The solid-state storage module 2 is disposed in the receiving space S of the case 1. The heat dissipation unit 3 is connected to the case 1. The heat dissipation unit 3 covers the receiving space S and is thermally connected to the solid-state storage module 2. The heat dissipation unit 3 includes a working fluid F, a cooling channel 39 and at least one heat conductive rib (for example, the first heat conductive rib and the second heat conductive rib mentioned below). The cooling channel 39 extends into the heat dissipation unit 3. The working fluid F travels in the cooling channel 39. The heat conductive rib (for example, the first heat conductive rib or the second heat conductive rib mentioned below) extends into the cooling channel 39. The solid-state storage device H satisfies the specification of SNIA SFF-TA-1008.

Figure 3A:
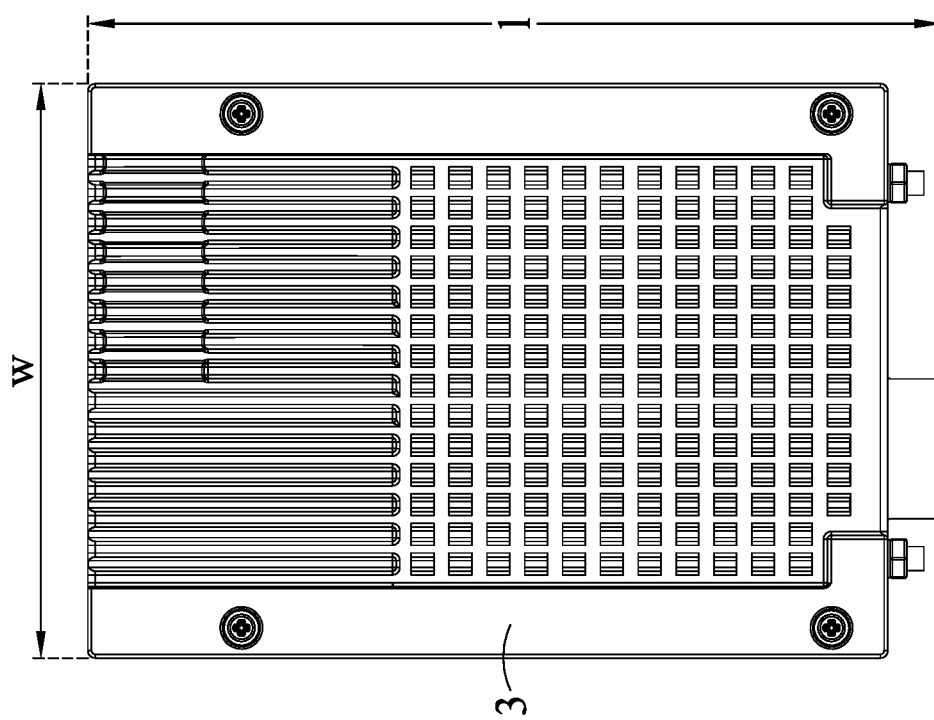
FIG. 3A is a top view of the solid-state storage device of the embodiment of the invention.
Figure 3B:
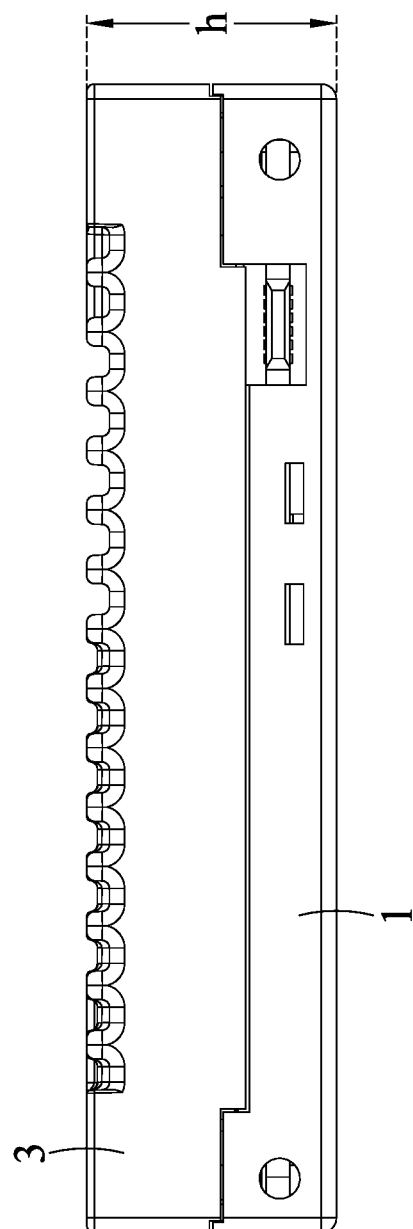
FIG. 3B is a front view of the solid-state storage device of the embodiment of the invention.

FIG. 3A is a top view of the solid-state storage device of the embodiment of the invention. FIG. 3B is a front view of the solid-state storage device of the embodiment of the invention. With reference to FIGS. 3A and 3B, in one embodiment, since the solid-state storage device H satisfies the specification of SNIA SFF-TA-1008, the length 1 of the solid-state storage device H can be 112.75±0.4 mm, the width w of the solid-state storage device H can be 75±0.25 mm, and the height h of the solid-state storage device H can be smaller than 16.8 mm.

In one embodiment, the solid-state storage device H satisfies the specification of E3S-2T. In this embodiment, the power consumption of the solid-state storage device H is smaller than 40 W.

Figure 4A:
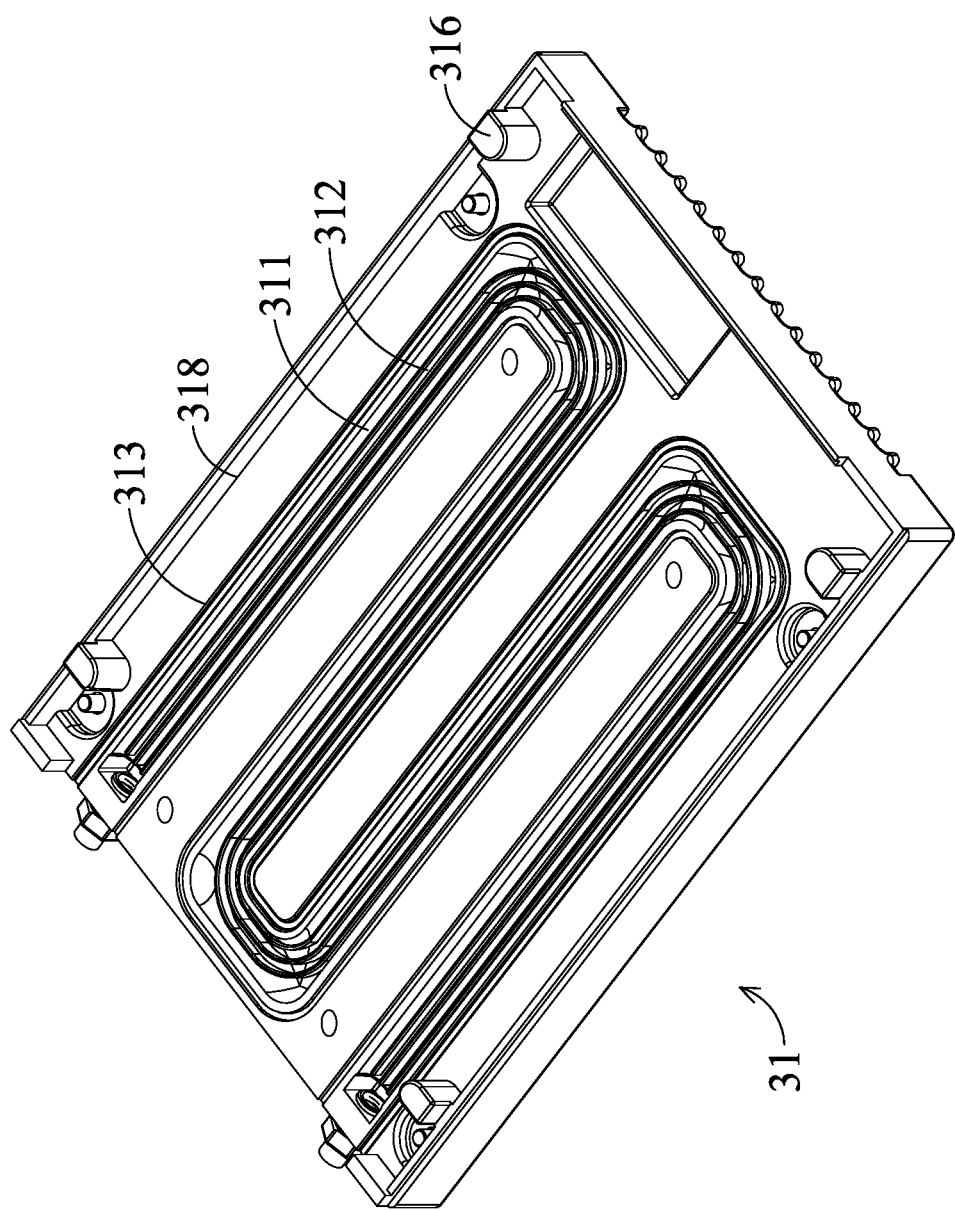
FIG. 4A shows a first unit housing of the embodiment of the invention.
Figure 4B:
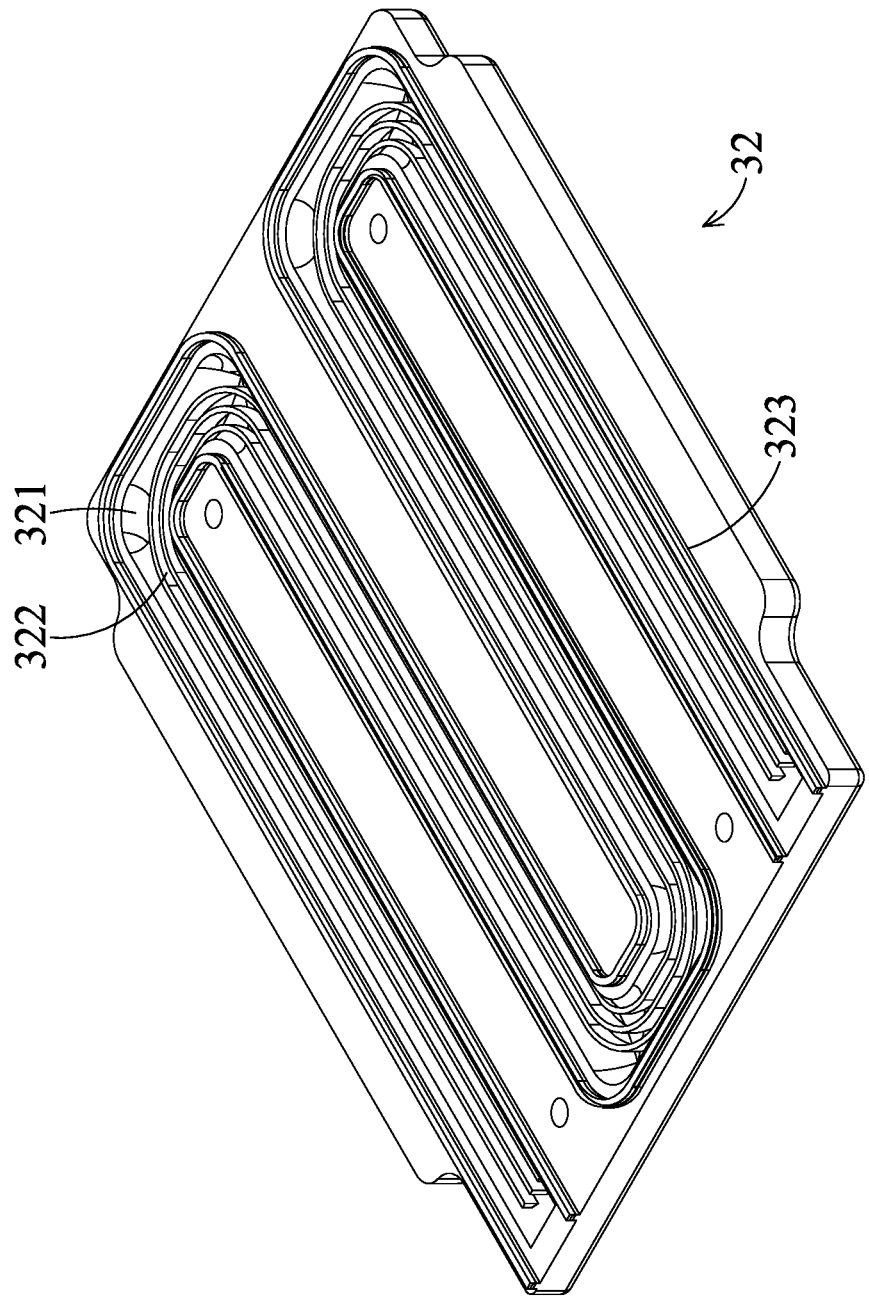
FIG. 4B shows a second unit housing of the embodiment of the invention.

FIG. 4A shows a first unit housing of the embodiment of the invention. FIG. 4B shows a second unit housing of the embodiment of the invention. With reference to FIGS. 2, 4A and 4B, in one embodiment, the heat dissipation unit 3 comprises a first unit housing 31 and a second unit housing 22. The second unit housing 32 is located between the first unit housing 31 and the solid-state storage module 2. The first unit housing 31 comprises a first groove 311. The second unit housing 32 comprises a second groove 321. The first groove 311 is combined with the second groove 321 to form the cooling channel 39.

Figure 4C:
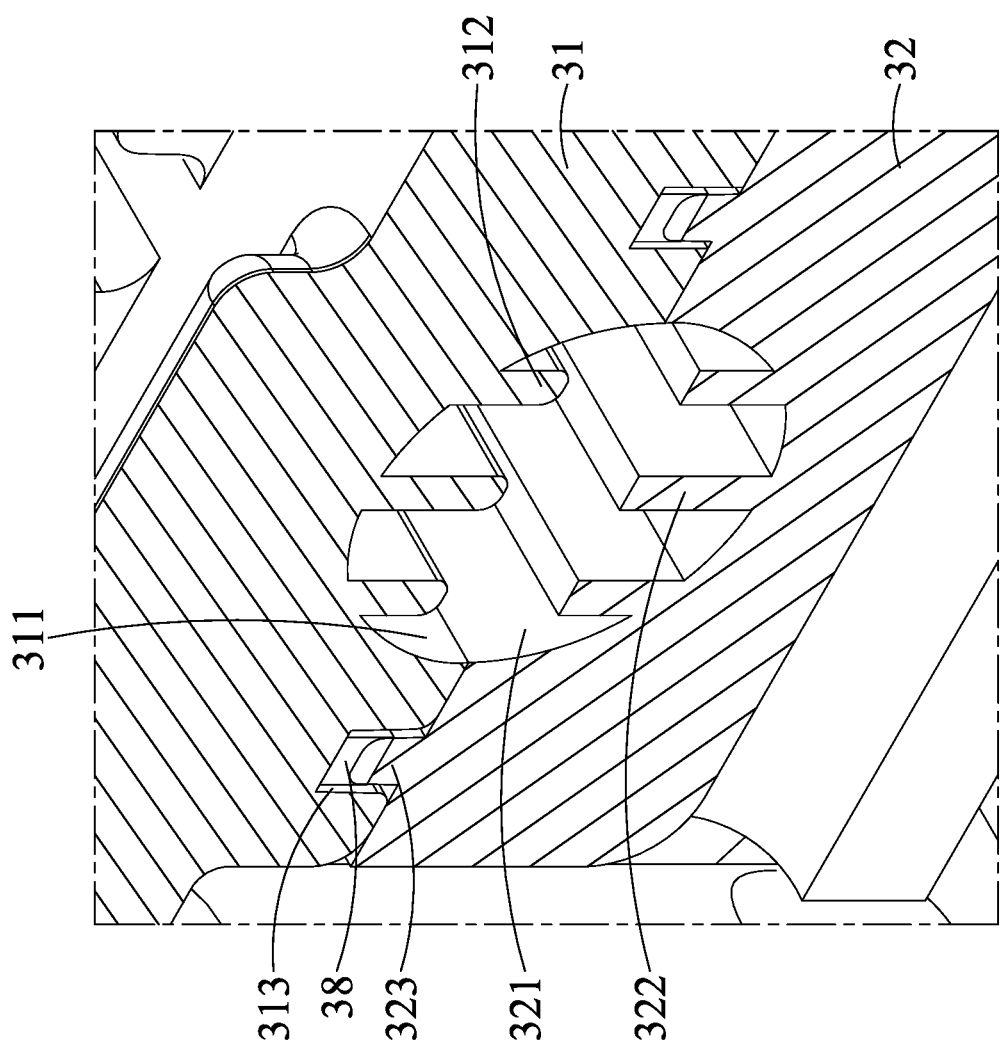
FIG. 4C is a cross sectional view of a portion of the heat dissipation unit of the embodiment of the invention.

FIG. 4C is a cross sectional view of a portion of the heat dissipation unit of the embodiment of the invention. With reference to FIGS. 4A, 4B and 4C, in one embodiment, the first unit housing 31 comprises a plurality of first heat conductive ribs 312. The first heat conductive ribs 312 are formed in the first groove 311 and extend along the first groove 311. The second unit housing 32 comprises a plurality of second heat conductive ribs 322. The second heat conductive ribs 322 are formed in the second groove 321 and extend along the second groove 321. The first heat conductive ribs 312 correspond to the second heat conductive ribs 322.

With reference to FIGS. 2, 4A, 4B and 4C, in one embodiment, the heat dissipation unit 3 further comprises two elastic waterproof strips 38. The first unit housing 31 comprises two waterproof slots 313. The waterproof slots 313 are formed on both sides of the first groove 311 and extend along the first groove 311. The elastic waterproof strips 38 are embedded in the waterproof slots 313.

With reference to FIGS. 2, 4A, 4B and 4C, in one embodiment, the second unit housing 32 comprises two waterproof ribs 323. The waterproof ribs 323 are formed on both sides of the second groove 321 and extend along the second groove 321. The waterproof ribs 323 press the elastic waterproof strips 38, and the waterproof ribs 323 are inserted into the waterproof slots 313.

With reference to FIG. 2, in one embodiment, the heat dissipation unit 3 further comprises a first joint 341 and a second joint 342. The first joint 341 is connected to the first unit housing 31 and the second unit housing 32 and communicates with one end of the cooling channel 39. The second joint 342 is connected to the first unit housing 31 and the second unit housing 32 and communicates with the other end of the cooling channel 39.

With reference to FIG. 2, in one embodiment, the first unit housing 31 comprises a plurality of heat dissipation protrusions 319 and a first surface 314. The heat dissipation protrusions 319 are formed on the first surface 314.

With reference to FIG. 2, in one embodiment, the heat dissipation protrusions 319 comprise a plurality of first heat dissipation protrusions 319A and a plurality of second heat dissipation protrusions 319B. The first heat dissipation protrusions 319A are arranged in a matrix. Each second heat dissipation protrusion 319B is longer than each first heat dissipation protrusion 319A. The second heat dissipation protrusions 319B are parallel to each other.

Figure 4D:
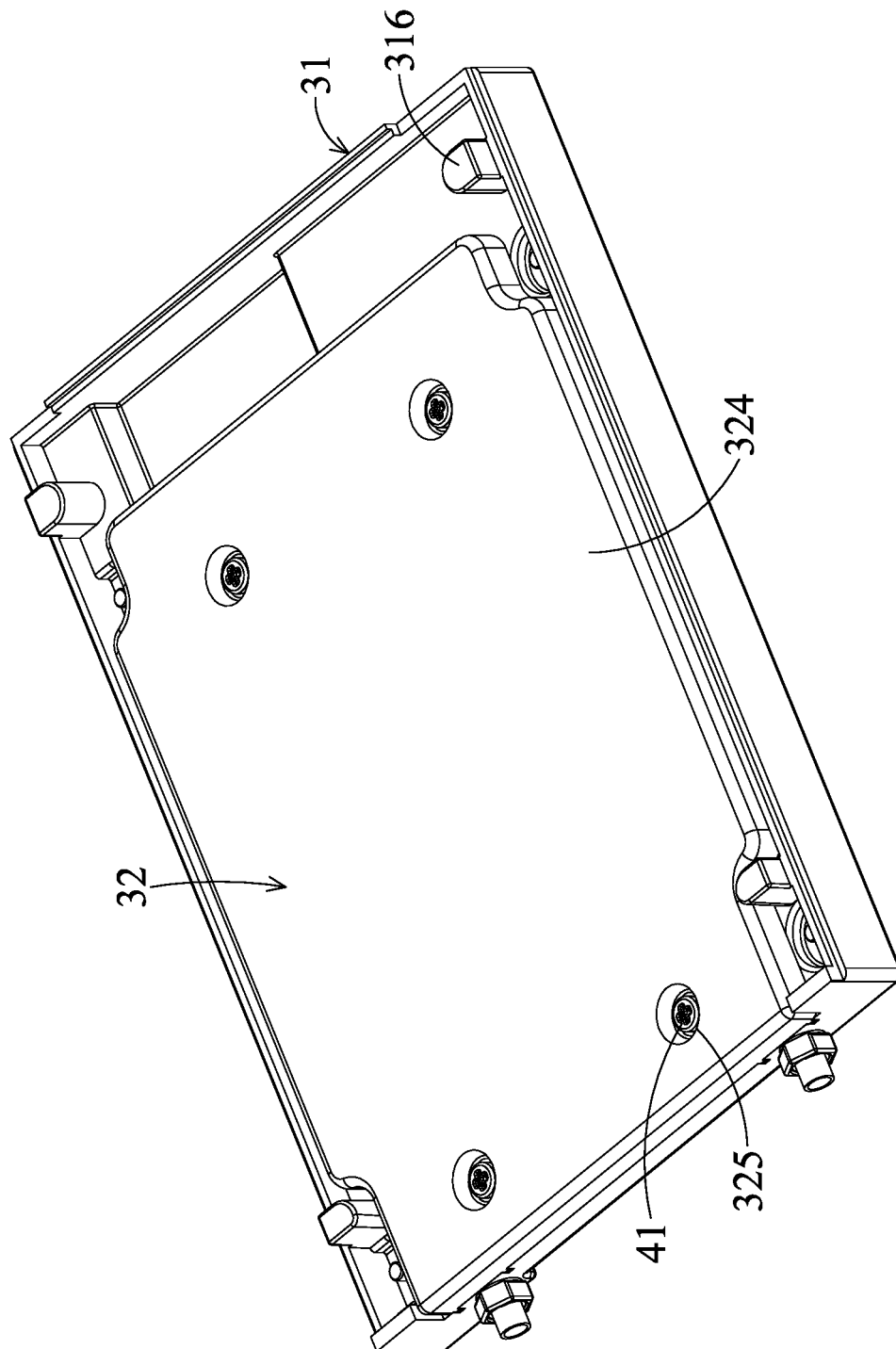
FIG. 4D shows the heat dissipation unit of the embodiment of the invention of another view angle.

FIG. 4D shows the heat dissipation unit of the embodiment of the invention of another view angle. With reference to FIG. 4D, in one embodiment, the second unit housing 32 comprises a second surface 324. The second surface 324 is opposite to the first surface 314. The second surface 324 faces the solid-state storage module 2. The second surface 324 is connected to the solid-state storage module 2.

With reference to FIGS. 2 and 4D, in one embodiment, the heat dissipation unit 3 comprises a plurality of unit bolts 41. The second unit housing 32 comprises a plurality of housing through holes 325. The unit bolts 41 pass through the housing through holes 325 from the second surface 324 to affix the second unit housing 32 to the first unit housing 31.

With reference to FIGS. 2 and 4D, in one embodiment, the second surface 324 can contact the solid-state storage module 2 directly, and be thermally connected to the solid-state storage module 2 via thermal pads or thermal paste. In this embodiment, the solid-state storage device further comprises a plurality of thermal pads 43. The thermal pads 43 are sandwiched between the solid-state storage module 2 and the second surface 324 of the second unit housing 32.

With reference to FIG. 2, in one embodiment, the solid-state storage module 2 comprises a substrate 21, a controller chip 22, a plurality of DRAM chips 23 and a plurality of flash memory chips 24. The controller chip 22, the DRAM chips 23 and the flash memory chips 24 are disposed on the substrate 21. The controller chip 22, at least a portion of the DRAM chips 23 and at least a portion of the flash memory chips 24 are thermally connected to the second surface 324 of the second unit housing 32 via the thermal pads 43. Therefore, the heat generated from the controller chip 22, at least a portion of the DRAM chips 23 and at least a portion of the flash memory chips 24 can be sufficiently transmitted to the heat dissipation unit 3.

With reference to FIG. 2, in one embodiment, the solid-state storage module 2 further comprises a plurality of power supplies 25 and a capacitor 26. The power supplies 25 and the capacitor 26 are disposed on the substrate 21.

With reference to FIGS. 2 and 4D, in one embodiment, the heat dissipation unit 3 comprises a plurality of restriction stages 316. The restriction stages 316 abut the solid-state storage module 2 and restrict the solid-state storage module 2.

Figure 5B:
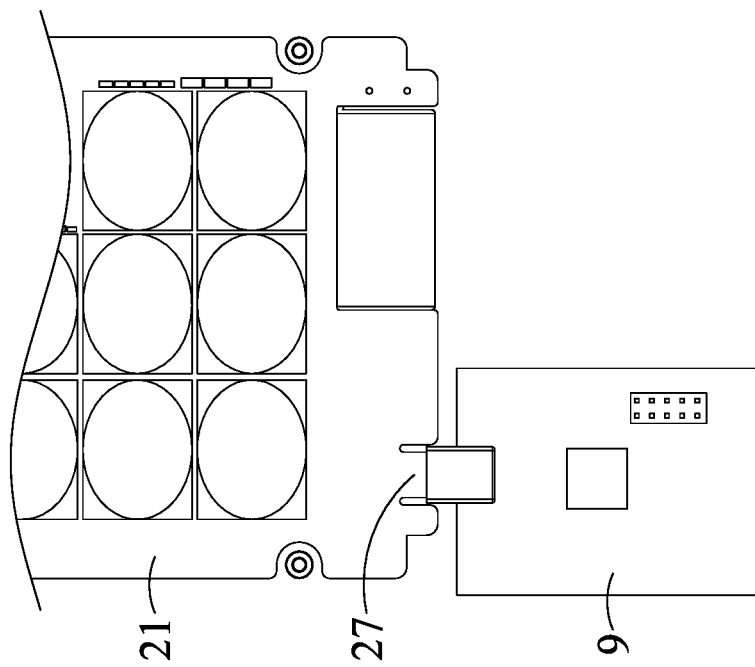
FIG. 5B shows the solid-state storage device of the embodiment of the invention being detected via the debug port.
Figure 5A:
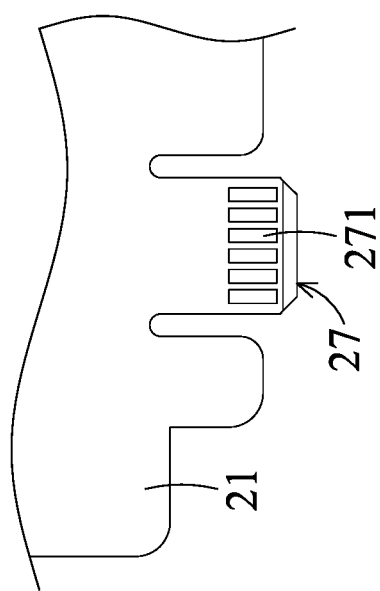
FIG. 5A shows a debug port of the embodiment of the invention.

FIG. 5A shows a debug port of the embodiment of the invention. FIG. 5B shows the solid-state storage device of the embodiment of the invention being detected via the debug port. With reference to FIGS. 2, 4D, 5A and 5B, in one embodiment, the solid-state storage module 2 comprises a debug port 27. The debug port 27 comprises a gold finger port 271. The debug port 27 is formed on an edge of the substrate 21. The restriction stages 326 abut the substrate 21 and restrict the substrate 21. A debug device 9 is adapted to be connected to the debug port 27, and detects the solid-state storage device.

With reference to FIG. 2, in one embodiment, the case 1 comprises a plurality of positioning posts 19. The substrate 2 comprises a plurality of positioning holes 29. The positioning posts 19 pass through the positioning holes 29 to restrict the substrate 2.

With reference to FIG. 2, in one embodiment, the positioning holes 19 comprise at least one circular hole and at least one ellipse hole. The substrate 2 thus can be smoothly connected to the positioning posts 19.

With reference to FIGS. 2, 4A and 4D, in one embodiment, the restriction stages 316 are formed on the first unit housing 31.

With reference to FIGS. 1 and 2, in one embodiment, the solid-state storage device H further includes a plurality of device bolts 42. The case 1 comprises a plurality of case fastening bases 17. The first unit housing 31 comprises a plurality of unit through holes 317. The device bolts 42 pass through the unit through holes 317 to affix the first unit housing 31 to the case fastening bases 17 of the case 1.

In one embodiment, the specification of the device bolts 42 are the same with the specification of the unit bolts 41. The cost of the bolts can be decreased, and the effort required for assembly is reduced.

Figure 6:
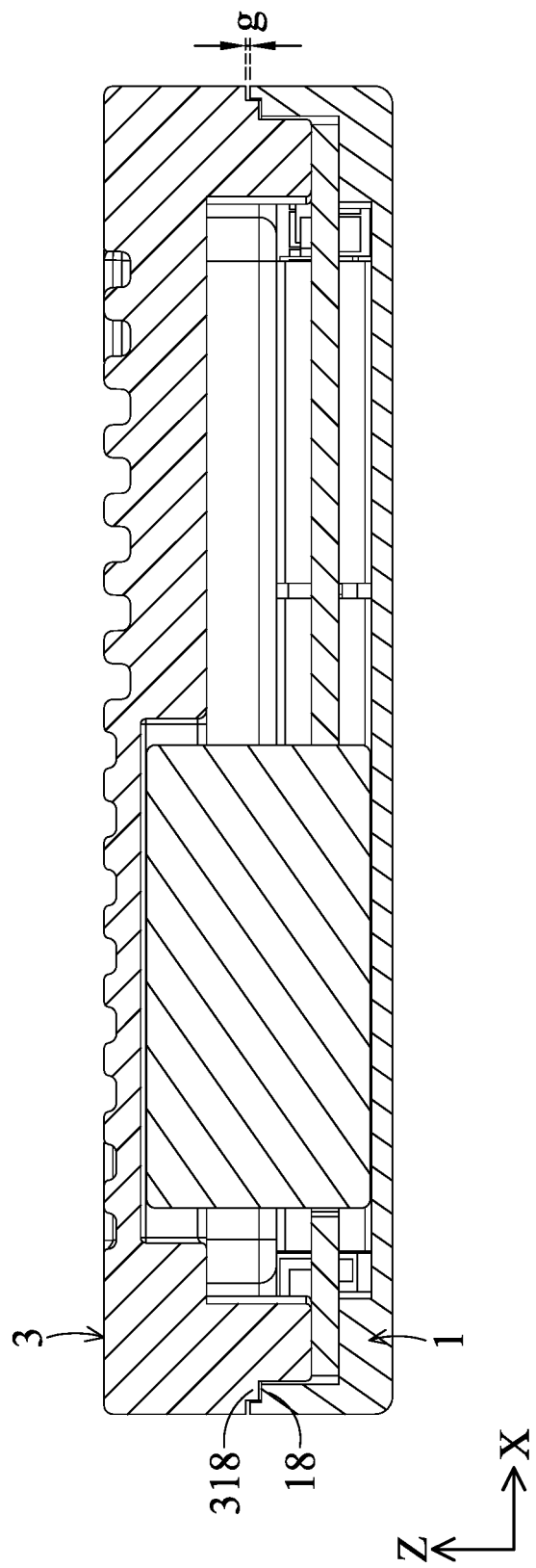
FIG. 6 is a cross sectional view of the solid-state storage device of the embodiment of the invention.

FIG. 6 is a cross sectional view of the solid-state storage device of the embodiment of the invention. With reference to FIGS. 2, 4A and 6, in one embodiment, a unit stepped-structure 318 is formed on an edge of the unit housing 31. A case stepped-structure 18 is formed on an edge of the case 1. When the case 1 is combined with the heat dissipation unit 3, the unit stepped-structure 318 is connected to the case stepped-structure 18.

With reference to FIGS. 2, 4A and 6, in one embodiment, the device bolt 42 is affixed to the first unit housing 31 and case 1 along a first direction Z. A gap g is formed between the unit stepped-structure 318 and the case stepped-structure 18 on the first direction Z. The unit stepped-structure 318 abuts the case stepped-structure 18 along a second direction X. The second direction X is perpendicular to the first direction Z. With the gap g, the restriction stages 316 can sufficiently contact the solid-state storage module 2, and restrict the position of the solid-state storage module 2. In one embodiment, the case stepped-structure 18 abuts the unit stepped-structure 318 further along a first direction Y. The third direction Y is perpendicular to the first direction Z and the second direction X.

Figure 7:
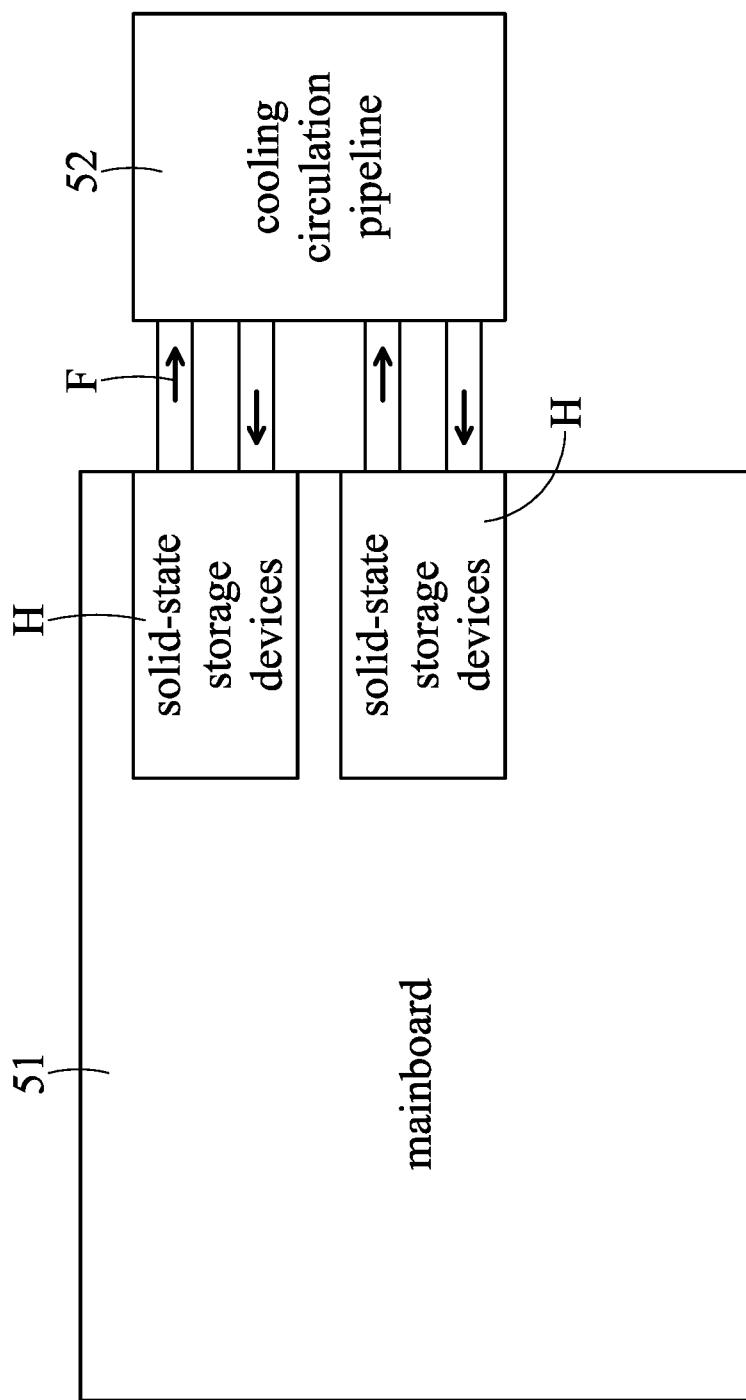
FIG. 7 shows a server apparatus of the embodiment of the invention.

FIG. 7 shows a server apparatus of the embodiment of the invention. With reference to FIG. 7, in one embodiment, the server apparatus of the embodiment of the invention includes a mainboard 51, a cooling circulation pipeline 52 and a plurality of solid-state storage devices H. The solid-state storage devices H are coupled to the circuit board 51. The cooling channel of each solid-state storage device H communicates with the cooling circulation pipeline 52. A working fluid F travels in the cooling channel and the cooling circulation pipeline 52.

In the solid-state storage device of the embodiment of the invention, the heat dissipation unit is thermally connected to the solid-state storage module to remove heat. The receiving space is formed by the heat dissipation unit and the case, and the thickness of the solid-state storage device can be reduced to satisfy the specification of SNIA SFF-TA-1008. The heat conductive rib is disposed in the cooling channel to improve heat conduction effect. The restriction stages abut the solid-state storage module and restrict the solid-state storage module, and the number of the bolts for assembly is reduced.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solid-state storage device, comprising:
a case, comprising a receiving space;
a solid-state storage module, disposed in the receiving space of the case; and
a heat dissipation unit, connected to the case, wherein the heat dissipation unit covers the receiving space and is thermally connected to the solid-state storage module, the heat dissipation unit comprises a working fluid, a cooling channel and at least one heat conductive rib, the cooling channel extends into the heat dissipation unit, the working fluid travels in the cooling channel, and the heat conductive rib extends into the cooling channel,
wherein the solid-state storage device satisfies the specification of SNIA SFF-TA-1008.

2. The solid-state storage device as claimed in claim 1, wherein the solid-state storage device satisfies the specification of E3S-2T.

3. The solid-state storage device as claimed in claim 1, wherein the heat dissipation unit comprises a first unit housing and a second unit housing, the second unit housing is located between the first unit housing and the solid-state storage module, the first unit housing comprises a first groove, the second unit housing comprises a second groove, and the first groove is combined with the second groove to form the cooling channel.

4. The solid-state storage device as claimed in claim 3, wherein the first unit housing comprises a plurality of first heat conductive ribs, the first heat conductive ribs are formed in the first groove and extend along the first groove, the second unit housing comprises a plurality of second heat conductive ribs, the second heat conductive ribs are formed in the second groove and extend along the second groove, and the first heat conductive ribs correspond to the second heat conductive ribs.

5. The solid-state storage device as claimed in claim 3, wherein the heat dissipation unit further comprises two elastic waterproof strips, the first unit housing comprises two waterproof slots, the waterproof slots are formed on both sides of the first groove and extend along the first groove, and the elastic waterproof strips are embedded in the waterproof slots.

6. The solid-state storage device as claimed in claim 5, wherein the second unit housing comprises two waterproof ribs, the waterproof ribs are formed on both sides of the second groove and extend along the second groove, the waterproof ribs press the elastic waterproof strips, and the waterproof ribs are inserted into the waterproof slots.

7. The solid-state storage device as claimed in claim 3, wherein the heat dissipation unit further comprises a first joint and a second joint, the first joint is connected to the first unit housing and the second unit housing and communicates with one end of the cooling channel, and the second joint is connected to the first unit housing and the second unit housing and communicates with the other end of the cooling channel.

8. The solid-state storage device as claimed in claim 3, wherein the first unit housing comprises a plurality of heat dissipation protrusions and a first surface, and the heat dissipation protrusions are formed on the first surface.

9. The solid-state storage device as claimed in claim 8, wherein the heat dissipation protrusions comprise a plurality of first heat dissipation protrusions and a plurality of second heat dissipation protrusions, the first heat dissipation protrusions are arranged in a matrix, a length of each second heat dissipation protrusion is longer than a length of each first heat dissipation protrusion, and the second heat dissipation protrusions are parallel to each other.

10. The solid-state storage device as claimed in claim 8, wherein the second unit housing comprises a second surface, the second surface is opposite to the first surface, the second surface faces the solid-state storage module, and the second surface is connected to the solid-state storage module.

11. The solid-state storage device as claimed in claim 10, wherein the heat dissipation unit comprises a plurality of unit bolts, the second unit housing comprises a plurality of housing through holes, and the unit bolts pass through the housing through holes from the second surface to affix the second unit housing to the first unit housing.

12. The solid-state storage device as claimed in claim 10, further comprising a plurality of thermal pads, wherein the thermal pads are sandwiched between the solid-state storage module and the second surface of the second unit housing.

13. The solid-state storage device as claimed in claim 10, wherein the solid-state storage module comprises a substrate, a controller chip, a plurality of DRAM chips and a plurality of flash memory chips, wherein the controller chip, the DRAM chips and the flash memory chips are disposed on the substrate, and the controller chip, at least a portion of the DRAM chips and at least a portion of the flash memory chips are thermally connected to the second surface of the second unit housing via the thermal pads.

14. The solid-state storage device as claimed in claim 13, wherein the solid-state storage module further comprises a plurality of power supplies and a capacitor, and the power supplies and the capacitor are disposed on the substrate.

15. A server apparatus, comprising:
a mainboard;
a cooling circulation pipeline; and
a plurality of solid-state storage devices, coupled to the circuit board, wherein
at least one of the solid-state storage devices comprises:
a case, comprising a receiving space;
a solid-state storage module, disposed in the receiving space of the case; and a heat dissipation unit, connected to the case, wherein the heat dissipation unit covers the receiving space and is thermally connected to the solid-state storage module, the heat dissipation unit comprises a cooling channel and at least one heat conductive rib, the cooling channel extends into the heat dissipation unit, the cooling channel communicates with the cooling circulation pipeline, a working fluid travels in the cooling channel and the cooling circulation pipeline, and the heat conductive rib extends into the cooling channel, wherein the solid-state storage device satisfies the specification of SNIA SFF-TA-1008.

* * * * *